United States Patent [19]

Hankins et al.

[11] Patent Number: 4,635,345
[45] Date of Patent: Jan. 13, 1987

[54] METHOD OF MAKING AN INTERGRATED VERTICAL NPN AND VERTICAL OXIDE FUSE PROGRAMMABLE MEMORY CELL

[75] Inventors: Kevin T. Hankins; Mark W. Michael, both of Palm Bay, Fla.; Brian K. Rosier, Jenkintown, Pa.

[73] Assignee: Harris Corporation, Melbourne, Fla.

[21] Appl. No.: 711,816

[22] Filed: Mar. 14, 1985

[51] Int. Cl.⁴ ............... H01L 21/20; H01L 21/479
[52] U.S. Cl. ........................... 29/577 C; 29/571; 29/576 B; 148/1.5; 148/187; 357/42; 357/43; 357/91
[58] Field of Search ............ 29/577 C, 571, 576 B; 148/1.5, 187; 357/42, 43, 91

[56] References Cited

U.S. PATENT DOCUMENTS

| 3,506,887 | 4/1970 | Gutteridge | 317/234 |
|---|---|---|---|
| 3,576,549 | 4/1971 | Hess et al. | 29/586 |
| 3,634,929 | 1/1972 | Yoshida et al. | 29/577 |
| 3,668,655 | 6/1972 | Allen | 340/173 SP |
| 3,781,977 | 1/1974 | Hulmes | 29/584 |
| 3,783,048 | 1/1974 | Sanders | 148/187 |
| 4,153,949 | 5/1979 | Rau, III et al. | 365/104 |
| 4,267,633 | 5/1981 | Seiler | 29/578 |
| 4,312,046 | 1/1982 | Taylor | 365/104 |
| 4,386,968 | 6/1983 | Hinkel et al. | 148/1.5 |
| 4,403,399 | 9/1983 | Taylor | 29/574 |
| 4,424,578 | 1/1984 | Miyamoto | 365/104 |
| 4,437,897 | 3/1984 | Kemlage | 148/1.5 |
| 4,441,249 | 4/1984 | Alspector et al. | 29/577 C |
| 4,455,194 | 6/1984 | Yabu et al. | 29/578 |
| 4,562,639 | 1/1986 | McElroy | 29/584 |
| 4,569,120 | 2/1986 | Stacy et al. | 29/574 |

OTHER PUBLICATIONS

Briska et al, IBM-TDB, 23 (1980) 644.
Campbell et al, IBM-TDB, 25 (1983) 6147.

Primary Examiner—Upendra Roy
Attorney, Agent, or Firm—Barnes & Thornburg

[57] ABSTRACT

A method of forming an aligned vertical oxide fuse and emitter using a single mask. The mask includes an opening through which impurities are introduced into the base region through a first layer of insulation and which is subsequently used to form the emitter aperture through the first insulative layer. The thin fuse oxide is formed by non-selective oxidation after removal of the mask. Alternatively, the impurities may also be introduced through the emitter aperture or from doped thin fuse oxide after removal of the mask. The resulting integrated circuit includes at least three regions of oxidation of three thicknesses, in descending order, field oxide, device opening or gate oxide and fuse oxide.

19 Claims, 12 Drawing Figures

METHOD OF MAKING AN INTERGRATED VERTICAL NPN AND VERTICAL OXIDE FUSE PROGRAMMABLE MEMORY CELL

BACKGROUND AND SUMMARY OF THE INVENTION

The present invention relates generally to fuses and more specifically to vertical fuses.

Integrated circuit designers are always attempting to reduce the amount of chip area needed for specific devices. In memory arrays, efforts to reduce the size have included using vertical fuses instead of horizontal fuses. To further increase the density, an oxide forms the vertical fusible link separating a top contact from a diode or bipolar transistor in the substrate. A typical example are U.S. Pat. Nos. 3,576,549 to Hess et al.; 3,668,655 to Allen and 3,781,977 to Hulmes.

The use of epitaxial or polycrystalline layers as fuse elements over the emitter of an emitter follower array is shown in U.S. Pat. No. 4,312,046 to Taylor. These vertical fuses are programmed by electromigration of the aluminum top contact through the fuse layer. In an effort to protect the emitter follower transistor from the avalanche induced migration of Taylor, a barrier layer may be provided between the fusible element and the emitter. This is specifically shown in U.S. Pat. No. 4,424,578 to Miyamoto.

Although these patents show vertical fuses which have increased the packing density on the surface of a die, they generally include multiple masking steps to form the emitter opening to produce the emitter as well as separate and distinct steps to form the vertical fuse element.

Thus, it is a primary object of the present invention to provide a process for fabricating an improved vertical fuse having minimal processing steps.

Another object of the present invention is to provide a process for fabricating vertical fuses with a minimal number of steps with alignment of the vertical fuse to the emitter.

Still another object of the present invention is to provide a method of fabricating a vertical fuse with a minimum number of masking steps which is also compatible with a combined insulated gate field effect transistor and bipolar memory circuit.

These and other objects of the invention are attained by forming a mask on a first insulative layer on a substrate having an opening corresponding to the to be formed emitter region, introducing impurities into the opening followed by forming an emitter aperture in the first insulative layer using the mask layer. The mask layer is removed and the substrate is oxidized to form a thin oxide fuse region in the emitter aperture. A top electrode is formed on the thin oxide region. Thus, a single mask is used for the formation of the emitter regions, the emitter aperture, and the subsequently formed thin oxide fuse region. Preferably, the emitter is formed by ion implanting the impurities using the mask layer.

As an alternative, the mask layer would be used only to form an emitter aperture in the first layer followed by oxidizing to form the thin oxide fuse and providing a doped polycrystalline material as the top gate. After rupture of the thin oxide fuse, the dopant of the polycrystalline top gate will diffuse impurities into the substrate to form the emitter region. The doped polycrystalline top electrode may also be the gate of an insulated gate field effect transistor formed simultaneously with the bipolar transistor and vertical fuse.

As another alternative, the top electrode may be of a metal and the substrate having an appropriate impurity concentration such that upon rupture of the thin fuse region, the top metal contact comes into contact with the surface of the substrate and forms a metal to substrate rectifying junction as the emitter base junction. In all embodiments, the first insulative layer is thicker than the thin oxide layer and thinner than the field oxide. When formed in conjunction with insulated gate field effect transistors, the gate oxide layer step may form all or a portion of the first insulative layer in which the vertical oxide fuse is formed.

As a further alternative, the mask layer is used to form an emitter aperture in the first layer. The mask is removed and impurities are introduced from a gaseous atmosphere. After washing the aperture, the thin oxide fuse is formed in the aperture by oxidation. The thin oxide fuse and the source of impurities can be formed simultaneously from a common gaseous environment. The impurities are diffused by subsequent heating steps.

An integrated circuit of the present invention would generally include a substrate, a field oxide on the substrate having a first thickness, at least one bipolar transistor, a first insulative layer having a second thickness less than the first thickness over the bipolar transistor, a second insulative layer having a third thickness less than the second thickness over the formed or to be formed emitter region and having a substantially equal area to the lateral area of a formed or to be formed emitter region. A top electrode on the second insulative layer produces a vertical fuse between the top electrode and the bipolar transistor.

Other objects, advantages and novel features of the present invention will become apparent from the following detailed description of the invention when considered in conjunction with the accompanying drawings.

DETAILED DESCRIPTION OF THE DRAWINGS

Figure 1:
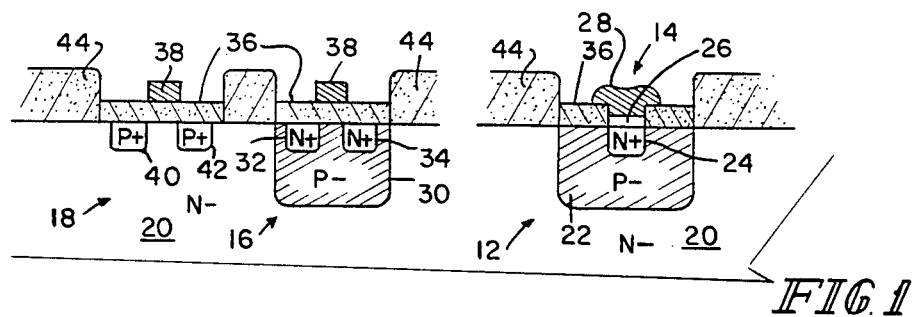
FIG. 1 is a cross-sectional view of an integrated circuit incorporating the principles of the present invention.

An integrated circuit, as illustrated in FIG. 1 including a bipolar transistor 12, a fuse 14 and complementary insulated gate field effect transistors 18 and 20 built in an N− substrate 20. The bipolar transistor 12 includes a P− base region 22 and an N+ emitter region 24. The vertical fuse 14 includes a thin oxide fusible element 26 between the emitter region 24, forming the bottom electrode, and top electrode 28. The N channel insulated gate field effect transistor 16 includes a P− body region 30 in which are formed N+ source and drains 32 and 34. A gate oxide region 36 separates the gate 38 from the channel portion of body region 30. The P channel insulated gate field effect transistor 18 includes P+ source and drain regions 40 and 42 formed in the substrate 20 and also includes a gate oxide layer 36 and a gate 38. A field oxide layer 44 is shown extending above the substrate 20.

Although the field oxide layer 44 is shown extending above the substrate 20, it may be formed by local oxidation and therefore may extend above and below the surface in which the bipolar transistor 12 and the insulated gate field effect transistors 18 and 20 are formed. Similarly, other forms of isolation may be used for example, isoplanar, polyplanar and dielectrically isolated regions. It should also be noted that the insulative layer 36 which forms the gate insulative layer in the insulated gate field effect transistors 16 and 18 is also formed over the base region 22 of the bipolar transistor 12. The field oxide 44 has a thickness in the range of 5,000 to 10,000 Angstroms, the gate oxide region 36 has a thickness in the range of 200 to 600 Angstroms and the vertical oxide fuse 26 has a thickness in the range of 40 to 200 Angstroms. Bipolar oxide has a thickness in the range of 400 to 2,000 Angstroms, and may include said gate oxide.

It should be noted that FIG. 1 represents the wafer prior to formation of the contacts to the source and drain regions and insulation over the gates 38. The integrated circuit at this stage of formation best illustrates the relative thicknesses of the insulative layers which form the essence of the present invention.

Although the integrated circuit of described FIG. 1 and the to be described FIGS. 2–9, are shown using an N− substrate, and NPN bipolar transistors, a P substrate may be used with PNP transistors as the driving element for the fuses.

The operation of the fuse 14 of FIG. 1 includes applying a voltage between top electrode 28 and emitter 24 to rupture the oxide layer 26 causing the top electrode 28 to come into contact with the emitter 24. The principle of operation is rupture of the oxide 26.

Figure 2:
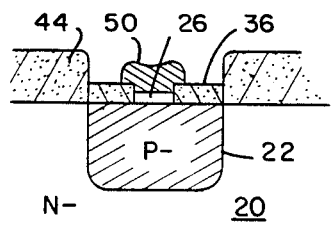
FIG. 2 is a cross-section of a second embodiment of a vertical fuse incorporating the principles of the present invention.
Figure 3:
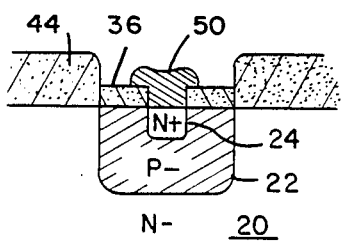
FIG. 3 is a cross-sectional view of the vertical fuse of FIG. 2 after programming.

As a first alternative, the emitter region 24 need not be formed in the base region 22 prior to programming. As illustrated in FIG. 2, the top gate 50 may be formed of a polycrystalline material doped with N-type impurities and separated from the base region 22 by the vertical oxide fuse layer 26. Upon applying an appropriate voltage between the base 22 and the top electrode 50, the oxide region 26 ruptures bringing the polycrystalline contact 50 into contact with the base region 22. Upon continued application of the voltage, impurities are diffused from the doped polycrystalline electrode 50 to form an N emitter region 24′ as illustrated in FIG. 3. For an oxide fuse layer 24 having a thickness of 65 Angstroms, the application of a voltage of 12 to 14 volts produced an NPN bipolar transistor having a beta of approximately 10 at a base current of 0.1 milliamps. This is approximately one half of the beta of the bipolar transistor of FIG. 1.

Figure 4:
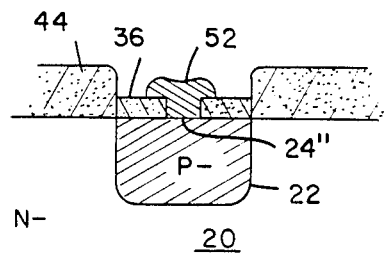
FIG. 4 is a cross-sectional view of a third embodiment of the vertical fuse after programming.

Another alternative similar to the alternative of FIG. 2 would also include not forming the emitter region N+ 24. In this embodiment, a top electrode 52 is selected of an appropriate metal and the impurity concentration of the P− region 22 is also selected such that upon application of a voltage which will rupture the thin oxide fuse region 26, the top electrode 52 comes into contact with the P− base region 22 and forms a Schottky or rectifying junction 24′ therewith as illustrated in FIG. 4. This junction forms the emitter. A typical example of metals to be used as a top electrode 52 with a P− region include aluminum with the impurity concentration of the P− region in the range of $5 \times 10^{15}$ to $3 \times 10^{16}$ atoms per cubic centimeter. Alternatively, a PNP may be used having an N− base region and an appropriate metal to form a metal to semiconductor rectifying junction. As is well known, aluminum would be an appropriate metal to be used with an N− region having an impurity concentration below $10^{17}$ atoms per cubic centimeter. Because of the interaction of aluminum with silicon and silicon dioxide, precaution should be taken in the subsequent manufacturing steps.

Figure 5:
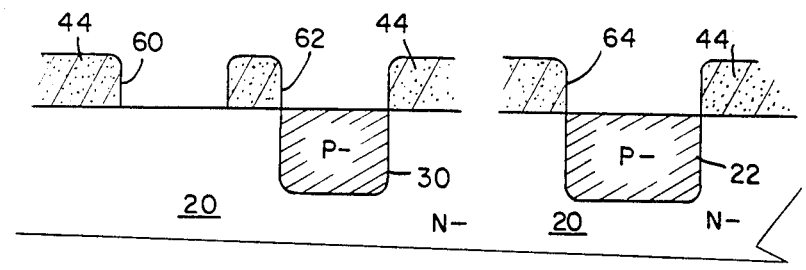
Figure 6:
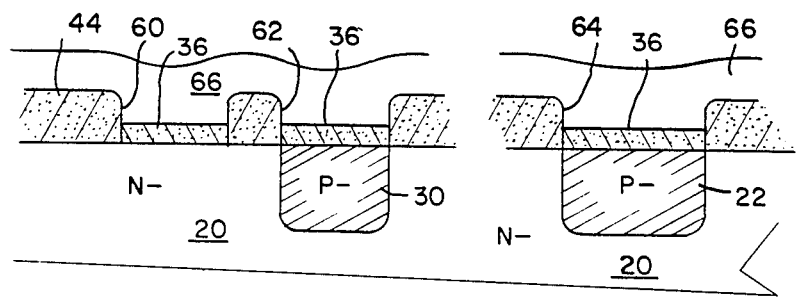
Figure 7:
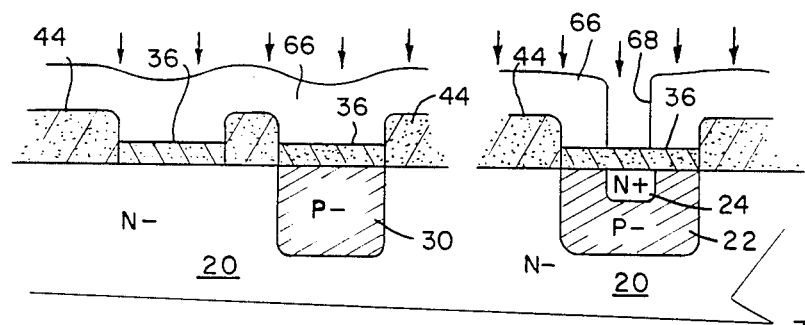

The process for fabricating the integrated circuit of FIG. 1 includes forming the field oxide 44 on or in the substrate 20. As discussed previously, this may be performed using local oxidation, or general oxidation of the surface with subsequent patterning to form device openings 60, 62 and 64 for the P channel, N channel and bipolar transistors, respectively. Alternatively, oxide filled trenches may be used. P-type impurities are introduced to form the P− base region 22 and P− body region 30 as illustrated in FIG. 5. This step may be performed using appropriate masking steps. The device openings 60, 62 and 64 are cleaned and gate oxide layer 36 is formed in the device openings 60, 62 and 64. A masking material 66 for example, photoresist material, is applied over the substrate as illustrated in FIG. 6. The masking material 66 is patterned by for example, exposure and development to form an emitter opening 68 therein. N-type impurities for example, arsenic or phosphorus are induced by ion implantation at a dose of for example, $2 \times 10^{14}$ atoms per cubic centimeter at an energy of 30 KeV. This produces emitter region 24 as illustrated in FIG. 7. The ion implantation is through the oxide region 36 with the mask layer 66 protecting the remainder of the integrated circuit.

Figure 9:
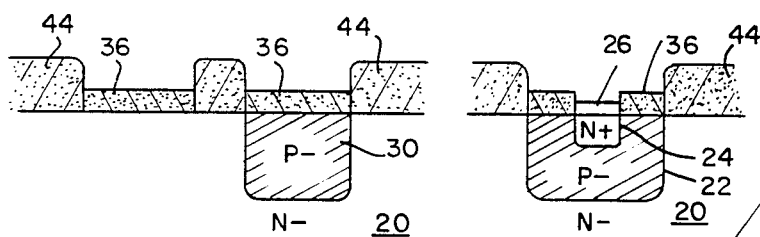
FIGS. 5–9 are cross-sectional views of a substrate at various steps of fabrication according to the principles of the present invention.
Figure 8:
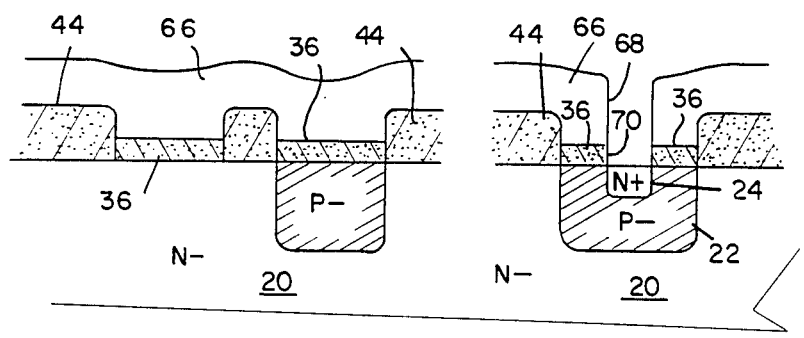

Using the same mask material 66, portions of the oxide layer 36 are removed to form an oxide aperture 70 in the insulative layer 36. This may be performed by wet or dry etching. The resulting structure is illustrated in FIG. 8. The masking layer 66 is then removed and the wafer is given a deglaze to clean the surface of the gate oxide layers 36. The wafer is then introduced into a gaseous oxidation atmosphere to form the fuse oxide 26 as illustrated in FIG. 9. The top contact and gate material is provided and patterned to form a top contact 28 and gates 38. Preferably, this process includes depositing polycrystalline silicon and patterning. The polycrystalline silicon is generally doped to reduce its resistance.

The field oxide 44 generally has a thickness in step 5 in the range of 5,000–10,000 Angstroms, for example. The gate oxide layer 36 in FIGS. 6–8 generally is grown to have a thickness of 330 Angstroms. During the formation of the gate oxide region 36, the field oxide 44 does not appreciably increase in thickness. The oxidation which forms the fuse oxide region 26 to approximately 80 Angstroms increases the gate oxide layer 36 to approximately 350 Angstroms.

Once the gates 38 are formed, the source and drain regions 32, 34, 40 and 42 may be formed by self-aligned gate techniques. This is common in the art and will not be described here in detail. Also, as previously discussed, the wafer at FIG. 1 may be further processed to provide additional passivation layers as well as contacts to the source and drain regions and portions of the bipolar array.

If the top electrode 28 is to be formed of metal and polycrystalline gates are preferred to be used for the insulated gate field effect transistors, or, if two separate polycrystalline silicon depositions are desired, the emitter masking, implant, deglaze and fuse oxidation should be performed following the application and patterning of the gate electrodes.

Figure 10:
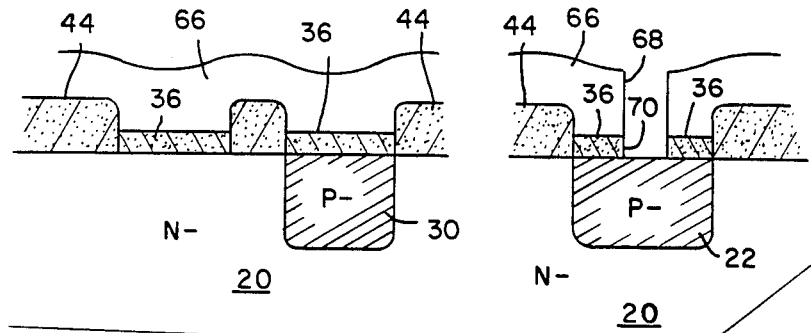
FIGS. 10–12 are cross-sectional views of a substrate at various steps of fabrication which are modifications of the steps of FIGS. 7 and 8.

The process for formation of the alternative embodiments of FIGS. 2 and 4 would use the same masking step as described in FIGS. 5 and 6. Opening 68 is formed in masking material 66 and emitter aperture 70 is formed in the oxide layer 36 as illustrated in FIG. 10.

Figure 11:
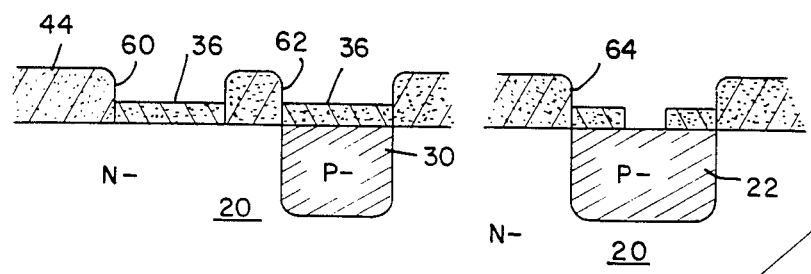
Figure 12:
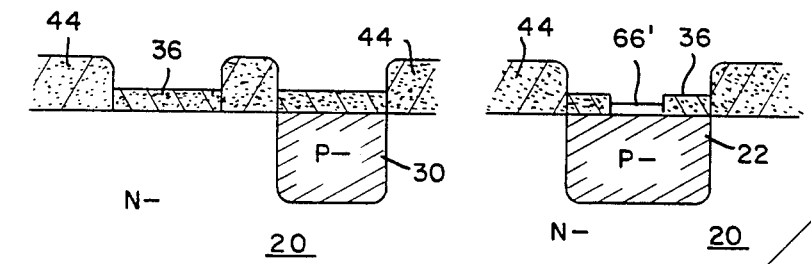

The masking material 66 is removed as illustrated in FIG. 11. The thin oxide layer 26 may be formed to produce the embodiment of FIG. 2. Subsequently, the top electrode is applied. Instead of forming region 24 by ion implantation, it can be formed by exposing the wafer of FIG. 11 to a gaseous atmosphere which include dopant impurities. The emitter aperture is washed to remove any material therein before the formation of the thin oxide fuse 26. As an alternative, the wafer of FIG. 11 could be exposed to a gaseous atmosphere which includes an oxidizing agent and dopant impurites. This forms a doped thin oxide region 26' as illustrated in FIG. 12. The subsequent processing steps cause diffusion of the impurities from the thin oxide region 26' into the P− region 22.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method of forming a vertical fuse and PN junction comprising:
   forming a mask layer on a first insulative layer on a semiconductor substrate, said substrate having a first region of a first conductivity type;
   patterning said mask layer to form at least one opening above said first region;
   introducing impurities through said opening to form a second region of a second conductivity type in said first region;
   forming an aperture in said first insulative layer corresponding to said opening using said mask layer;
   removing said mask layer;
   oxidizing said substrate to form a thin oxide fuse region in said aperture; and
   forming a top electrode on said thin oxide fuse region.

2. A method according to claim 1, wherein said substrate is of said second conductivity type.

3. A method according to claim 1, wherein said impurities are introduced by ion implantation through said first insulative layer.

4. A method according to claim 1, wherein said substrate is oxidized by being exposed to a gaseous oxidizing atmosphere.

5. A method of forming a vertical fuse and bipolar transistor comprising:
   forming a mask layer on a first insulative layer on a semiconductor substrate of a first conductivity type, said substrate having a first region of a second conductivity type;
   patterning said mask layer to form at least one opening above said first region;
   forming an aperture in said first insulative layer corresponding to said opening in said mask;
   removing said mask layer;
   oxidizing said substrate to form a thin oxide fuse region in said aperture; and
   forming a top electrode of polycrystalline material doped with impurities of said first conductivity type in said aperture;
   the thickness of the thin oxide fuse region and the doping level of said polycrystalline top contact are selected so as to rupture said thin oxide fuse region and diffuse impurities in said first region thereby forming a contact and second region in said first region upon application of a sufficient voltage across said thin oxide fuse region.

6. A method according to claim 5, wherein said first insulative layer is thick enough to form a mask so that impurities are introduced only throuqh said aperture during said diffusion.

7. A method according to claim 5, wherein said substrate is oxidized by being exposed to a gaseous oxidizing atmosphere.

8. A method of forming a vertical fuse and PN junction comprising:
   forming a mask layer on a first insulative layer on a semiconductor substrate, said substrate having a first region of a first conductivity type;
   patterning said mask layer to form at least one opening above said first region;
   forming an aperture in said first insulative layer corresponding to said opening using said mask layer;
   removing said mask layer;
   oxidizing said substrate to form a thin oxide fuse region in said aperture; and
   forming a top electrode on said thin oxide fuse region of a metal which would form a rectifying contact with said first region after rupture of said thin oxide fuse.

9. A method according to claim 8, wherein said substrate is oxidized by being exposed to a gaseous oxidizing atmosphere.

10. A method of forming insulated gate field effect transistors, bipolar transistors and vertical fuses in an integrated circuit comprising:
    forming a plurality of device openings in a first insulative layer having a first thickness on a substrate in which insulated gate field effect transistors and bipolar transistors are to be formed;
    forming a second insulative layer in said device opening having a second thickness less than said first thickness;
    forming emitter apertures in said second insulative layer;
    forming a third insulative layer in said emitter apertures having a third thickness less than said second thickness;
    forming a top electrode on said third layer in said emitter aperture;
    said second layer being sufficiently thick compared to said third layer so that said third layer will rupture upon application of a sufficient voltage thereacross without effecting said second layer.

11. A method according to claim 10, wherein gates of said insulated gate field effect transistor are formed on said second layer simultaneously with the formation of said top electrode.

12. A method according to claim 10, including forming a mask on said second insulative layer having an emitter opening defining said emitter aperture, introducing impurities through said emitter opening to form an emitter region and using said mask to form said emitter apertures in said second layer.

13. A method according to claim 10, wherein said top contact is formed of a doped polycrystalline material having a doping level sufficient to form an emitter and contact by diffusing of impurities into said substrate after rupture of said third layer.

14. A method according to claim 10, wherein said top contact is formed of a metal which forms a rectifying contact with said substrate after rupture of said third layer.

15. A method according to claim 10, including forming a gate on said second layer in those device openings in which insulated gate field effect transistors are to be formed.

16. A method of forming a vertical fuse and PN junction comprising:
  forming a mask layer on a first insulative layer on a semiconductor substrate, said substrate having a first region of a first conductivity type;
  patterning said mask layer to form at least one opening above said first region;
  forming an aperture in said first insulative layer corresponding to said opening using said mask layer;
  removing said mask layer;
  exposing said aperture to a gaseous atmosphere having an oxidizing agent and impurities of a second conductivity type to form a second region of a second conductivity type in said first region and a thin oxide fuse region in said aperture; and
  forming a top electrode on said thin oxide fuse region.

17. A method according to claim 16, wherein said thin oxide fuse is formed to have a depth smaller than said first insulative layer.

18. A method of forming a vertical fuse and PN junction comprising:
  forming a mask layer on a first insulative layer on a semiconductor substrate, said substrate having a first region of a first conductivity type;
  patterning said mask layer to form at least one opening above said first region;
  forming an aperture in said first insulative layer corresponding to said opening using said mask layer;
  removing said mask layer;
  exposing said aperture to a gaseous atmosphere having impurities of a second conductivity type to form a second conductivity type region in said first region;
  non-selectively removing any material in said aperture;
  oxidizing said substrate to form a thin oxide fuse region in said aperture; and
  forming a top electrode on said thin oxide fuse region.

19. A method according to claim 18, wherein said thin oxide fuse is formed to have a depth smaller than said first insulative layer.

* * * * *